United States Patent
Fanelli

(10) Patent No.: US 9,515,181 B2
(45) Date of Patent: Dec. 6, 2016

(54) SEMICONDUCTOR DEVICE WITH SELF-ALIGNED BACK SIDE FEATURES

(71) Applicant: QUALCOMM Incorporated, San Diego, CA (US)

(72) Inventor: Stephen A. Fanelli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/453,595

(22) Filed: Aug. 6, 2014

(65) Prior Publication Data

US 2016/0042967 A1 Feb. 11, 2016

(51) Int. Cl.
*H01L 29/78* (2006.01)
*H01L 21/28* (2006.01)
*H01L 21/311* (2006.01)
*H01L 21/3115* (2006.01)

(52) U.S. Cl.
CPC ..... *H01L 29/7838* (2013.01); *H01L 21/28008* (2013.01); *H01L 21/31111* (2013.01); *H01L 21/31116* (2013.01); *H01L 29/7843* (2013.01); *H01L 21/31155* (2013.01)

(58) Field of Classification Search
CPC ........... H01L 27/1203; H01L 21/02164; H01L 29/6653; H01L 21/84; H01L 29/66628; H01L 21/823462; H01L 2224/03
See application file for complete search history.

(56) References Cited

U.S. PATENT DOCUMENTS

| | | | |
|---|---|---|---|
| 3,472,712 | A | 10/1969 | Bower |
| 3,475,234 | A | 10/1969 | Kerwin et al. |
| 4,053,916 | A | 10/1977 | Cricchi et al. |
| 4,939,568 | A | 7/1990 | Kato et al. |
| 5,229,647 | A | 7/1993 | Gnadinger |
| 5,372,952 | A | 12/1994 | Aronowitz et al. |

(Continued)

FOREIGN PATENT DOCUMENTS

| | | |
|---|---|---|
| CN | 1784785 A | 6/2006 |
| CN | 101140915 A | 3/2008 |

(Continued)

OTHER PUBLICATIONS

Office action dated Oct. 30, 2014 for U.S. Appl. No. 13/725,403.
(Continued)

*Primary Examiner* — Marc Armand
*Assistant Examiner* — Shannon Yi
(74) *Attorney, Agent, or Firm* — Haynes and Boone, LLP

(57) ABSTRACT

Various methods and devices that involve self-aligned features on a semiconductor on insulator process are provided. An exemplary method comprises forming a gate on a semiconductor on insulator wafer. The semiconductor on insulator wafer comprises a device region, a buried insulator, and a substrate. The exemplary method further comprises applying a treatment to the semiconductor on insulator wafer using the gate as a mask. The treatment creates a treated insulator region in the buried insulator. The exemplary method also comprises removing at least a portion of the substrate. The exemplary method also comprises, selectively removing the treated insulator region from the buried insulator to form a remaining insulator region after removing that portion of the substrate.

16 Claims, 11 Drawing Sheets

(56) References Cited

U.S. PATENT DOCUMENTS

| | | |
|---|---|---|
| 5,376,579 A | 12/1994 | Annamalai |
| 5,434,750 A | 7/1995 | Rostoker et al. |
| 5,489,792 A | 2/1996 | Hu et al. |
| 5,580,802 A | 12/1996 | Mayer et al. |
| 5,777,365 A | 7/1998 | Yamaguchi et al. |
| 5,793,107 A | 8/1998 | Nowak |
| 5,880,010 A | 3/1999 | Davidson |
| 5,955,767 A | 9/1999 | Liu et al. |
| 5,955,781 A | 9/1999 | Joshi et al. |
| 5,999,414 A | 12/1999 | Baker et al. |
| 6,025,252 A | 2/2000 | Shindo et al. |
| 6,027,958 A | 2/2000 | Vu et al. |
| 6,080,608 A | 6/2000 | Nowak |
| 6,110,769 A | 8/2000 | Son |
| 6,121,659 A | 9/2000 | Christensen et al. |
| 6,153,912 A | 11/2000 | Holst |
| 6,180,487 B1 | 1/2001 | Lin |
| 6,180,985 B1 | 1/2001 | Yeo |
| 6,190,985 B1 | 2/2001 | Buynoski |
| 6,191,476 B1 | 2/2001 | Takahashi et al. |
| 6,229,187 B1 | 5/2001 | Ju et al. |
| 6,320,228 B1 | 11/2001 | Yu |
| 6,335,214 B1 | 1/2002 | Fung |
| 6,352,882 B1 | 3/2002 | Assaderaghi et al. |
| 6,437,405 B2 | 8/2002 | Kim |
| 6,483,147 B1 | 11/2002 | Lin |
| 6,498,370 B1 | 12/2002 | Kim et al. |
| 6,531,753 B1 | 3/2003 | Lin |
| 6,566,240 B2 | 5/2003 | Udrea et al. |
| 6,573,565 B2 | 6/2003 | Clevenger et al. |
| 6,635,909 B2 | 10/2003 | Clark et al. |
| 6,680,240 B1 | 1/2004 | Maszara |
| 6,703,684 B2 | 3/2004 | Udrea et al. |
| 6,740,548 B2 | 5/2004 | Darmawan |
| 6,759,714 B2 | 7/2004 | Kim et al. |
| 6,833,587 B1 | 12/2004 | Lin |
| 6,847,098 B1 | 1/2005 | Tseng et al. |
| 6,889,429 B2 | 5/2005 | Celaya et al. |
| 6,900,501 B2 | 5/2005 | Darmawan |
| 6,900,518 B2 | 5/2005 | Udrea et al. |
| 6,927,102 B2 | 8/2005 | Udrea et al. |
| 7,052,937 B2 | 5/2006 | Clevenger et al. |
| 7,109,532 B1 | 9/2006 | Lee et al. |
| 7,119,431 B1 | 10/2006 | Hopper et al. |
| 7,135,766 B1 | 11/2006 | Costa et al. |
| 7,211,458 B2 | 5/2007 | Ozturk et al. |
| 7,227,205 B2 | 6/2007 | Bryant et al. |
| 7,235,439 B2 | 6/2007 | Udrea et al. |
| 7,238,591 B1 | 7/2007 | Lin |
| 7,244,663 B2 | 7/2007 | Kirby |
| 7,259,388 B2 | 8/2007 | Langdo et al. |
| 7,262,087 B2 | 8/2007 | Chidambarrao et al. |
| 7,381,627 B2 | 6/2008 | Bernstein et al. |
| 7,402,897 B2 | 7/2008 | Leedy |
| 7,411,272 B2 | 8/2008 | Udrea et al. |
| 7,452,761 B2 | 11/2008 | Zhu et al. |
| 7,485,571 B2 | 2/2009 | Leedy |
| 7,541,644 B2 | 6/2009 | Hirano et al. |
| 7,550,338 B2 | 6/2009 | Steegen et al. |
| 7,579,262 B2 | 8/2009 | Hoentschel et al. |
| 7,713,842 B2 | 5/2010 | Nishihata et al. |
| 7,745,277 B2 | 6/2010 | Chidambarrao et al. |
| 7,759,220 B2 | 7/2010 | Henley |
| 7,763,534 B2 | 7/2010 | Smayling et al. |
| 7,772,649 B2 | 8/2010 | Cheng et al. |
| 7,782,629 B2 | 8/2010 | Graydon et al. |
| 7,888,606 B2 | 2/2011 | Sakamoto et al. |
| 7,906,817 B1 | 3/2011 | Wu et al. |
| 7,977,221 B2 | 7/2011 | Ninomiya et al. |
| 8,013,342 B2 | 9/2011 | Bernstein et al. |
| 8,048,773 B2 | 11/2011 | Yamazaki et al. |
| 8,106,456 B2 | 1/2012 | Khater |
| 8,232,597 B2 | 7/2012 | Stuber et al. |
| 8,293,614 B2 | 10/2012 | Chu et al. |
| 8,357,975 B2 | 1/2013 | Stuber et al. |
| 8,367,512 B2 | 2/2013 | Fu et al. |
| 2002/0027271 A1 | 3/2002 | Vaiyapuri |
| 2002/0041003 A1 | 4/2002 | Udrea et al. |
| 2002/0079507 A1 | 6/2002 | Shim et al. |
| 2002/0086465 A1 | 7/2002 | Houston |
| 2002/0089016 A1 | 7/2002 | Joly et al. |
| 2002/0163041 A1 | 11/2002 | Kim |
| 2002/0175406 A1 | 11/2002 | Callahan |
| 2003/0085425 A1 | 5/2003 | Darmawan |
| 2003/0107084 A1 | 6/2003 | Darmawan |
| 2004/0051120 A1 | 3/2004 | Kato |
| 2004/0145058 A1 | 7/2004 | Marty et al. |
| 2004/0150013 A1 | 8/2004 | Ipposhi |
| 2004/0232554 A1 | 11/2004 | Hirano et al. |
| 2004/0245627 A1 | 12/2004 | Akram |
| 2004/0251557 A1 | 12/2004 | Kee |
| 2005/0124170 A1 | 6/2005 | Pelella et al. |
| 2005/0230682 A1 | 10/2005 | Hara |
| 2005/0236670 A1 | 10/2005 | Chien et al. |
| 2005/0263753 A1 | 12/2005 | Pelella et al. |
| 2006/0022264 A1 | 2/2006 | Mathew et al. |
| 2006/0065935 A1 | 3/2006 | Vandentop et al. |
| 2006/0183339 A1 | 8/2006 | Ravi et al. |
| 2006/0189053 A1 | 8/2006 | Wang et al. |
| 2006/0243655 A1 | 11/2006 | Striemer et al. |
| 2007/0018247 A1 | 1/2007 | Brindle et al. |
| 2007/0029553 A1 | 2/2007 | Ozturk et al. |
| 2007/0085131 A1 | 4/2007 | Matsuo et al. |
| 2007/0181992 A1 | 8/2007 | Lake |
| 2007/0190740 A1 | 8/2007 | Furukawa et al. |
| 2007/0254457 A1 | 11/2007 | Wilson et al. |
| 2008/0035970 A1* | 2/2008 | Wang ............... H01L 21/32051 257/295 |
| 2008/0050863 A1 | 2/2008 | Henson et al. |
| 2008/0081481 A1 | 4/2008 | Frohberg et al. |
| 2008/0128900 A1 | 6/2008 | Leow et al. |
| 2008/0150100 A1 | 6/2008 | Hung et al. |
| 2008/0165521 A1 | 7/2008 | Bernstein et al. |
| 2008/0283995 A1 | 11/2008 | Bucki et al. |
| 2008/0288720 A1 | 11/2008 | Atwal et al. |
| 2008/0296708 A1 | 12/2008 | Wodnicki et al. |
| 2009/0011541 A1 | 1/2009 | Corisis et al. |
| 2009/0026454 A1 | 1/2009 | Kurokawa et al. |
| 2009/0026524 A1 | 1/2009 | Kreupl et al. |
| 2009/0073661 A1 | 3/2009 | Wolfe et al. |
| 2009/0160013 A1 | 6/2009 | Abou-Khalil et al. |
| 2010/0032761 A1* | 2/2010 | Ding ............... H01L 21/823462 257/350 |
| 2010/0035393 A1 | 2/2010 | Aitken et al. |
| 2010/0140782 A1 | 6/2010 | Kim et al. |
| 2010/0314711 A1 | 12/2010 | Farooq et al. |
| 2011/0006367 A1 | 1/2011 | Fuller et al. |
| 2011/0012199 A1 | 1/2011 | Nygaard et al. |
| 2011/0012223 A1 | 1/2011 | Molin et al. |
| 2011/0108943 A1 | 5/2011 | Dennard et al. |
| 2011/0140257 A1 | 6/2011 | Sweeney et al. |
| 2011/0241073 A1 | 10/2011 | Cohen et al. |
| 2011/0266659 A1 | 11/2011 | Wilson et al. |
| 2012/0205725 A1 | 8/2012 | Nygaard et al. |
| 2013/0043595 A1 | 2/2013 | Williams |
| 2013/0049115 A1 | 2/2013 | Cheng et al. |
| 2013/0130479 A1 | 5/2013 | Stuber et al. |
| 2013/0134585 A1 | 5/2013 | Stuber et al. |
| 2013/0214356 A1* | 8/2013 | Cheng ............... H01L 21/84 257/347 |
| 2014/0035129 A1 | 2/2014 | Stuber et al. |
| 2014/0106494 A1* | 4/2014 | Bedell ............... H01L 21/84 438/49 |
| 2014/0175637 A1 | 6/2014 | Stuber et al. |
| 2014/0252448 A1* | 9/2014 | Bedell ............... H01L 29/788 257/316 |
| 2014/0342529 A1* | 11/2014 | Goktepeli ............... H01L 23/481 438/458 |

FOREIGN PATENT DOCUMENTS

| | | |
|---|---|---|
| EP | 0707388 A2 | 4/1996 |
| EP | 0986104 A1 | 3/2000 |

(56) References Cited

FOREIGN PATENT DOCUMENTS

| | | |
|---|---|---|
| GB | 2309825 A | 8/1997 |
| GB | 2418063 A | 3/2006 |
| JP | 2110974 | 4/1990 |
| JP | 03011666 | 1/1991 |
| JP | 04356967 | 12/1992 |
| JP | 07098460 | 4/1995 |
| JP | 9283766 | 10/1997 |
| JP | 2001230423 A | 8/2001 |
| JP | 2005175306 A | 6/2005 |
| JP | 2006186091 | 7/2006 |
| JP | 2008004577 A | 1/2008 |
| WO | 0225700 A2 | 3/2002 |
| WO | 2008011210 A1 | 1/2008 |
| WO | 2009045859 A1 | 4/2009 |

OTHER PUBLICATIONS

Extended European Search Report dated Sep. 22, 2015 for European Patent Application No. 15171021.7.
Notice of Allowance and Fees dated Aug. 31, 2015 for U.S. Appl. No. 14/572,580.
Office Action dated Aug. 4, 2015 for U.S. Appl. No. 13/725,403.
Office Action dated Aug. 5, 2015 for Chinese Patent Application No. 201080031818.X.
Office Action dated Sep. 2, 2015 for U.S. Appl. No. 14/586,668.
Official letter and search report dated Sep. 9, 2015 for Taiwanese Patent Application No. 099123131.
International Search Report and Written Opinion—PCT/US2015/042483—ISA/EPO—Dec. 14, 2015.
European Examination Report dated Mar. 19, 2013 for European Application No. 10 734 619.9.
Examination report dated Nov. 29, 2013 for European Application No. 10734619.9.
Guarini et al., "Electrical integrity of state-of-the-art 0.13 μm SOI CMOS devices and circuits transferred for three-dimensional (3D) integrated circuit (IC) fabrication," in Electron Devices Meeting, 2002, Dec. 8-11, 2002, pp. 943-945.
International Search Report and Written Opinion dated Oct. 14 2010 for PCT/US2010/042026.
International Search Report and Written Opinion dated Oct. 14, 2010 for PCT/US2010/042028.
International Search Report and Written Opinion dated Mar. 22, 2011 for International Application No. PCT/US2010/042027.
International Search Report and Written Opinion dated Mar. 31, 2014 for PCT Application No. PCT/US2013/073466.
Matloubian, M. "Smart Body Contact for SO1 MOSFETs", SOS/SOI Technology Conference, Oct. 3-5, 1989.
Notice of Allowance and Fees dated Aug. 19, 2014 for U.S. Appl. No. 13/725,245.
Notice of Allowance and Fees dated Aug. 20, 2014 for U.S. Appl. No. 13/725,306.
Notice of Allowance and Fees dated Jun. 18, 2014 for U.S. Appl. No. 13/746,288.
Notice of Allowance and Fees dated Nov. 27, 2012 for U.S. Appl. No. 13/459,110.
Notice of Allowance dated Mar. 22, 2012 for U.S. Appl. No. 12/836,506.
Office Action dated Apr. 23, 2014 for Chinese Patent Application No. 201080031814.1.
Office action dated Apr. 3, 2014 for U.S. Appl. No. 13/746,288.
Office Action dated Apr. 8, 2014 for Japanese Patent Application No. 2012-520758.
Office Action dated Aug. 31, 2012 for U.S. Appl. No. 12/836,559.
Office Action Dated Dec. 12, 2012 for U.S. Appl. No. 13/452,836.
Office action dated Dec. 2, 2013 for Chinese Patent Application No. 201080031818.X.
Office Action Dated Feb. 10, 2014 for U.S. Appl. No. 13/725,403.
Office Action dated Feb. 28, 2013 for U.S. Appl. No. 12/836,559.
Office Action dated Jan. 27, 2012 for U.S. Appl. No. 12/836,506.
Office Action dated Jul. 10, 2014 from Chinese Patent Application No. 201080031811.8.
Office Action dated Jul. 13, 2012 for U.S. Appl. No. 12/836,510.
Office Action dated Jul. 17, 2014 for U.S. Appl. No. 13/725,403.
Office Action dated Mar. 20, 2014 for U.S. Appl. No. 13/725,245.
Office action dated Mar. 28, 2014 for U.S. Appl. No. 13/725,306.
Office Action dated Mar. 29, 2013 for U.S. Appl. No. 13/746,288.
Office Action dated Nov. 9, 2012 for U.S. Appl. No. 12/836,510.
Office Action dated Nov. 5, 2013 for Chinese Patent Application No. 201080031811.8.
Office Action dated Oct. 9, 2013 for Chinese Application No. 201080031814.1.
Office Action dated Oct. 24, 2012 for U.S. Appl. No. 13/459,110.
Office Action dated Oct. 4, 2013 for U.S. Appl. No. 13/746,288.
Sematech Manufacturing and Reliability Challenges for 3D ICs using TSVs, Sep. 25-26, 2008, San Diego, California "Thermal and Strees Analysis Modeling for 3D Memory over Processor Stacks", John McDonald, Rochester Polytechnic Institute.
Sleight, Jeffry W. et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.
Tan et al., Wafer Level 3-D ICs Process Technology, 2008th ed. Springer, 2008, chapters 4, 5, 6, 8, 9, 10, and 12 (entire).
Notice of Allowance and Fees dated Feb. 11, 2015 for U.S. Appl. No. 12/836,559.
Notice of Allowance and Fees dated Feb. 20, 2015 for U.S. Appl. No. 12/836,510.
Office action dated Ferbuary 4, 2015 for Chinese patent application No. 201080031818.X.
Office Action dated Jan. 20, 2015 for Japanese Patent Application No. 2012-520758.
Office Action dated Jan. 6, 2015 for Chinese patent application No. 201080031811.8.
Office Action dated Mar. 27, 2015 for U.S. Appl. No. 14/572,580.
Office Action dated Mar. 5, 2015 for U.S. Appl. No. 13/725,403.
Official Letter and Search Report dated Feb. 13, 2015 for Taiwanese patent application No. 99123128.
Official Letter and Search Report dated Mar. 6, 2015 for Taiwanese Patent Application No. 99123144.
Office Action dated Aug. 29, 2014 for U.S. Appl. No. 12/836,510.
Office Action dated Jul. 28, 2014 for Chinese Patent Application No. 201080031818.X.
Office Action dated Oct. 7, 2014 for U.S. Appl. No. 12/836,559.
Office Action dated Apr. 13, 2015 in U.S. Appl. No. 14/586,668.

* cited by examiner

SEMICONDUCTOR DEVICE WITH SELF-ALIGNED BACK SIDE FEATURES

BACKGROUND OF THE INVENTION

The production of semiconductor devices at decreasing geometries and at lower costs has long been recognized as one of the key contributing factors to the widespread benefits of the digital age. The cost of a semiconductor device is set largely by the size of the substrate, the cost of materials that are consumed as the substrate is processed, and by the amount of capital overhead that is assignable to each part. The first two contributors to cost can be reduced by decreasing the size of the device, and by utilizing readily available materials. Capital overhead costs can be decreased by using readily available manufacturing equipment, and through the development of processing techniques that eliminate the need for more exotic equipment and reduce the time it takes to build each device. These processing techniques are sometimes associated with distinctive manufacturing features that provide evidence of how the device was made.

A self-aligned gate is a manufacturing feature that is indicative of a particular processing technique that can be described with reference to FIG. 1. Semiconductor wafer 100 comprises a substrate 101 covered by gate 102. As illustrated, gate 102 includes a photomask 103, a gate electrode 104, and a gate insulator 105. At this point in the process, photomask 103 has been used to create the gate stack. In other words, gate electrode 104 and gate insulator 105 previously had additional portions such that they extended lateral across the surface of substrate 101. Photomask 103 was then used to shield the gate stack while those additional portions were removed. Once gate 102 has been formed, photomask 103 can be put to use in another processing step. As illustrated in FIG. 1, gate 102 can serve as a mask to shield channel 107 while wafer 100 is exposed to a diffusion of dopants 108. As a result, photomask 103 can be used to not only form the gate stack, but also to create the source and drain regions of the transistor 109. Therefore, a different mask is not required for the creation of gate stack 102 and source and drain regions 109.

In addition to reducing the number of processing steps required, a self-aligned gate process produces an additional benefit in that the resulting device has superior characteristics when compared to devices formed according to certain alternative processing methodologies. The performance of a transistor is directly impacted by the interdependence of the gate, channel, source, and drain regions of the transistor. In particular, it is important to tightly control the location of the source-channel and drain-channel junctions relative to the gate of the transistor. As the same mask is used to form both the gate stack and the source and drain regions in a self-aligned gate process, errors resulting from the misalignment of two different masks are eliminated. The self-aligned gate process therefore provides for both a more cost effective and functionally superior device.

SUMMARY OF INVENTION

In one embodiment, a method comprises forming a gate on a semiconductor on insulator wafer. The semiconductor on insulator wafer comprises a device region, a buried insulator, and a substrate. The method also comprises applying a treatment to the semiconductor on insulator wafer using the gate as a mask. The treatment creates a treated insulator region in the buried insulator. The method also comprises removing at least a portion of the substrate. The method also comprises selectively removing the treated insulator region from the buried insulator to form a remaining insulator region after removing the portion of the substrate.

In another embodiment, a method comprises forming a gate on a semiconductor on insulator wafer. The semiconductor on insulator wafer comprises a device region, a buried insulator, and a substrate. The exemplary method further comprises applying a treatment to the semiconductor on insulator wafer using the gate as a mask. The treatment creates a treated insulator region in the buried insulator. The exemplary method also comprises removing at least a portion of the substrate. The exemplary method also comprises, selectively removing the treated insulator region from the buried insulator to form a remaining insulator region after removing that portion of the substrate.

In another embodiment, a semiconductor device comprises a gate formed on a semiconductor on insulator wafer. The semiconductor on insulator wafer comprises a device region and a buried insulator. The gate is formed on a top side of the device region. The device region is less than 100 nanometers thick. The semiconductor device also comprises a deposited layer located: (i) in an excavated region of the buried insulator; (ii) on a back side of the device region; and (iii) along a vertical edge of a remaining region of the buried insulator. A vertical edge of the gate is aligned to the vertical edge of the remaining region of the buried insulator within a margin of error. The margin of error is less than 80 nanometers.

FIG. 2 illustrates a semiconductor on insulator (SOI) structure 200 that includes semiconductor on insulator wafer 201, contact layer 202, and metallization layers 203. The SOI wafer 201 in turn comprises substrate 204, insulator layer 205, and active device layer 206. Substrate 204 can be a semiconductor material such as silicon. Insulator layer 205 can be a dielectric such as silicon dioxide formed through the oxidation of substrate 204. Active device layer 206 can include transistors that conduct the signal processing or power operations of device 200. As drawn, gate 207 serves as the gate for a transistor having a channel in active device layer 206 immediately below gate 207. Active device layer 206 is coupled to metallization layers 203 via contact layer 202. These layers can include a combination of dopants, dielectrics, polysilicon, metal wiring, passivation, and other layers, materials or components that are present after circuitry has been formed therein. The circuitry may include metal wiring, passive devices such as resistors, capacitors, and inductors; and active devices such as transistors and diodes.

As used herein and in the appended claims, the "top" of SOI structure 200 references a top surface 208 while the "bottom" of SOI structure 200 references a bottom surface 209. This orientation scheme persists regardless of the relative orientation of the SOI structure 200 to other frames of reference, and the removal of layers from, or the addition of layers to the SOI structure 200. Therefore, the active layer 206 is always "above" the insulator layer 205. In addition, a vector originating in the center of active layer 206 and extending towards the bottom surface 209 will always point in the direction of the "back side" of the SOI structure 200 regardless of the relative orientation of the SOI structure 200 to other frames of references, and the removal of layers from, or the addition of layers to the SOI structure 200.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Active device layer 206 of semiconductor on insulator (SOI) structure 200 is a critical region in terms of the performance of the semiconductor device of which structure 200 is a part. In order to create active devices with a desired characteristic, efforts need to be taken to protect the device layer from processing steps that introduce excessive variation into the active layer. For example, it is generally beneficial to not disrupt the interface between active device layer 206 and insulator layer 205. In particular, in the region of active device layer 206 in which a channel is to be formed, the interruption of this interface may create dangling bonds that will alter the relationship of the voltage in the gate electrode of gate 207 to the current in the channel region, and may deleteriously degrade the mobility of carries in the channel resulting in a device that cannot operate at high frequency. However, benefits can arise from patterning the insulator layer 205 from the back side such that different materials can be placed in close proximity to the channel of an active device without overly disrupting the active layer. For example, thermal dissipation layers can be placed in close proximity to the channel regions of active devices in active device layer 206 to channel heat away from the active devices. As another example, strain layers can be deposited in close proximity to the channel regions of the active devices to enhance the mobility of carriers in the channel. As a further example, electrical contacts can be formed through a patterned insulator that need to be aligned with contact regions that lie in or above active device layer 206.

Figure 1:
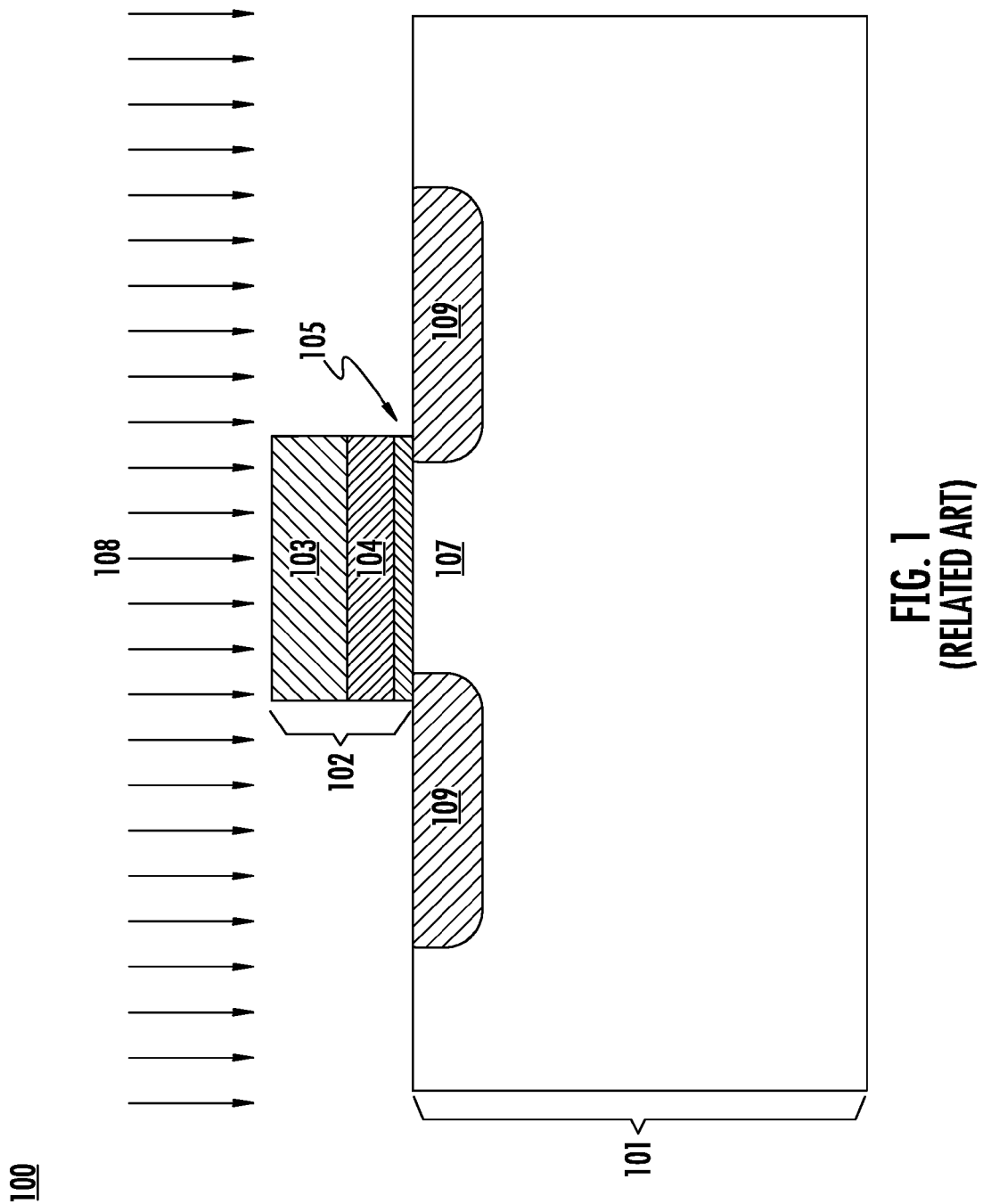
FIG. 1 illustrates a self-aligned implant for forming the source and drain of a transistor.
Figure 2:
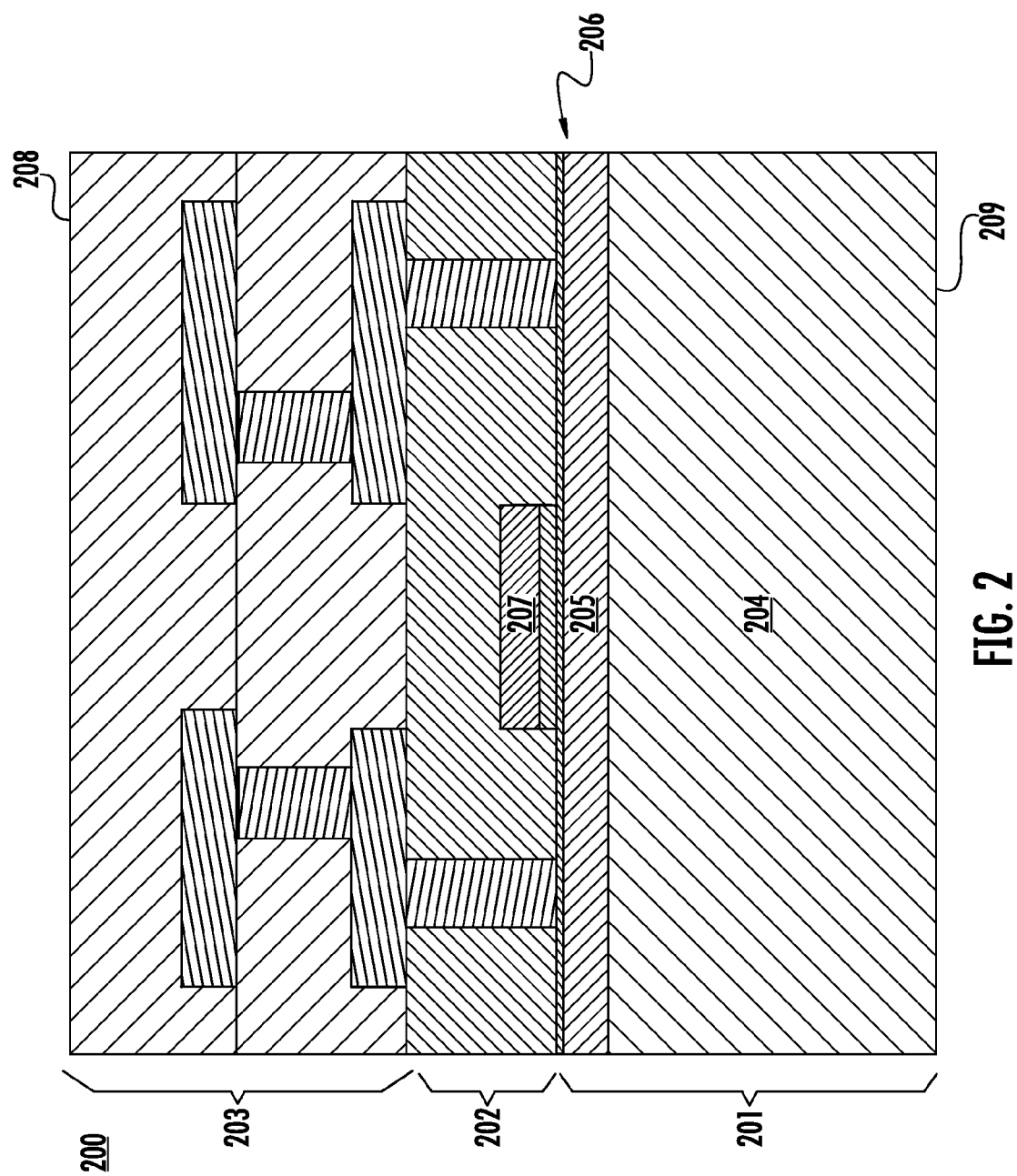
FIG. 2 illustrates a semiconductor on insulator structure.
Figure 3:
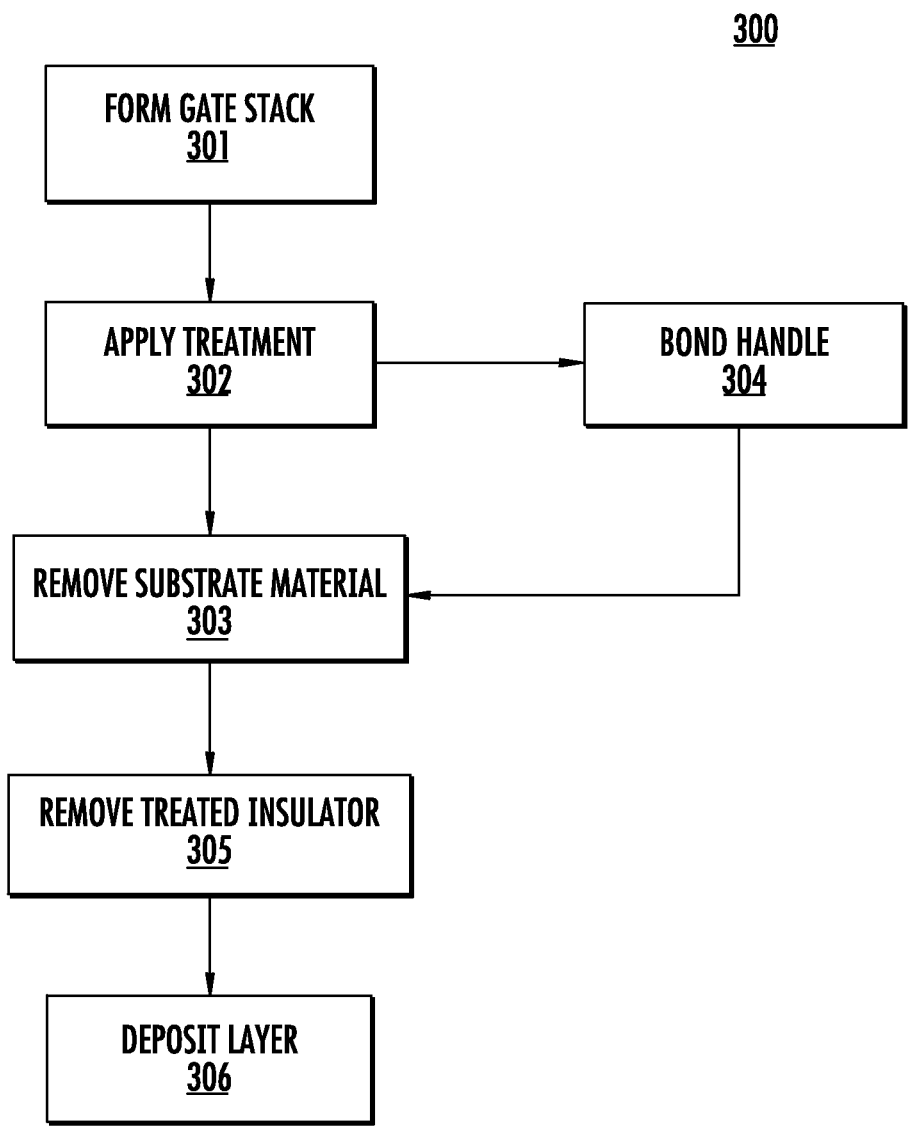
FIG. 3 illustrates a flow chart of a process for producing a semiconductor device with self-aligned back side features.

A method for producing a semiconductor structure with self-aligned back side features can be described with reference to the flow chart in FIG. 3 and the structure cross sections in FIGS. 4a-e. The process of FIG. 3 begins with step 301 in which a gate is formed on an SOI wafer. The gate can be the gate of a field effect transistor (FET) which can be a metal-oxide-semiconductor (MOS) FET or an insulated gate bipolar junction transistor (IGBT). The gate could also be the gate of any kind of FET including a FinFET, lateral diffusion MOS (LDMOS), or a vertical device. The active layer may provide a channel for fully depleted (FD) FET and may serve as an ultrathin body region for such a device. The gate will generally include an insulator and a gate electrode. For example, the gate insulator could be silicon dioxide and the gate electrode could be a layer of polysilicon formed on the gate insulator. The gate electrode could also comprise a metal, such as copper, tungsten, or molybdenum, or a metal silicide. The gate could also include additional insulators or layers of passivation to isolate the gate. For example, the gate could include sidewall spacers covering the gate stack in a vertical direction, and could include a gate cap covering the gate stack in a lateral direction opposite the gate insulator. Finally, the gate could also include a layer of photoresist or some other form of hard mask used to form the gate stack from layers of material with greater lateral extents than the final gate stack. These layers could be permanent features of the gate or they could be temporary layers that are removed before the device is finalized.

Figure 4A:
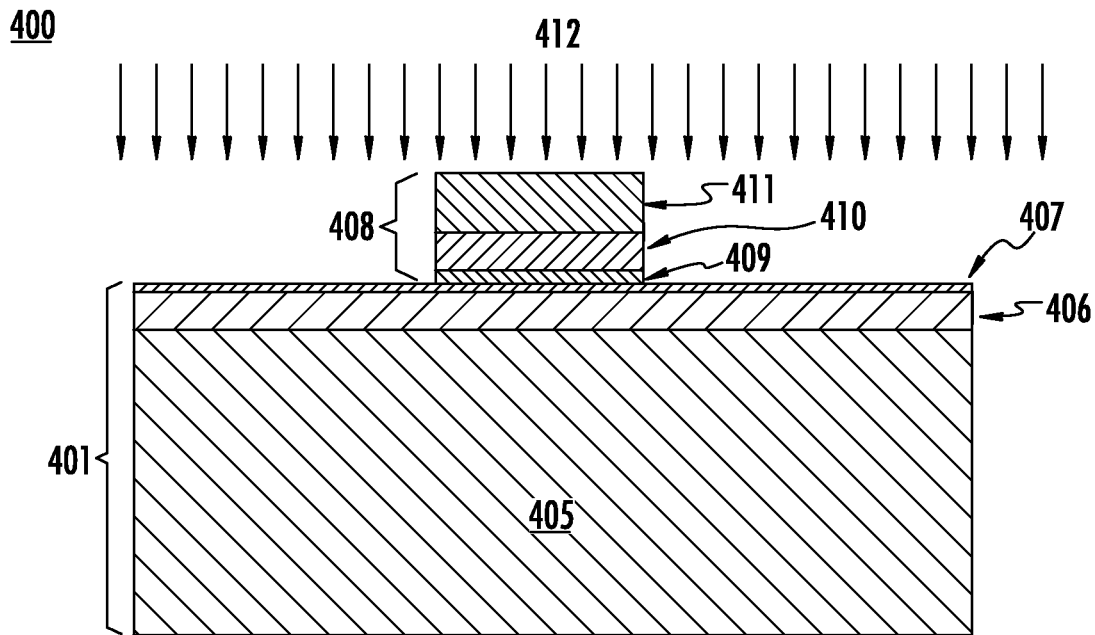
FIG. 4a-e illustrate a semiconductor structure at various stages of the process described with reference to FIG. 3.

SOI structure 400 in FIG. 4a includes SOI wafer 401 having substrate 405, buried insulator layer 406, and active device layer 407. As mentioned previously, substrate 405 can comprise a semiconductor such as silicon or an insulator such as sapphire. In situations where substrate 405 is an insulator, there may not be a distinction between buried insulator layer 406 and substrate 405. Buried insulator layer 406 could also be formed through the implantation of ions into a donor wafer, and substrate 405 could also be a handle wafer used to steady active device layer 407 as it is separated from that donor wafer. In situations where substrate 405 is silicon, buried insulator layer 405 could comprise silicon dioxide formed through the oxidation of substrate 405. In these situations, active device layer 407 can be formed through epitaxy. Alternatively, buried insulator layer 406 can be formed in a uniform substrate through the application of a SIMOX process. Regardless of the particular process used to prepare SOI wafer 401, buried insulator layer 406 can be referred to as a buried insulator because it is covered on a top side by active device layer 407 and covered on its back side by substrate 405. The term buried insulator can be used to describe this layer even if the substrate or active layers are removed to expose the insulator (i.e., the term "buried" refers to the physical region regardless of whether or not it remains buried in a finished device).

SOI structure 400 in FIG. 4a further illustrates gate 408 formed on the top side of the device region. As illustrate, gate 408 comprises three layers of material. Gate insulator 409 covers a portion of active device region 407 that will serve as the channel of a device formed in the active device region 407. Gate insulator 409 is covered by gate electrode 410. In this particular example, gate 408 also includes a layer of photoresist 411 that covers gate electrode 410. However, as mentioned previously, gate 408 might not include this additional layer, and the layer may or may not be a permanent feature of gate 408. In the illustrated example, photoresist 411 is removed from gate stack 408 before the device is finalized. However, photoresist 411 could also be replaced in the figure with a dielectric that will serve as a mask and as a permanent portion of the gate.

Process 300 continues with step 302 in which a treatment is applied to the SOI wafer using the gate as a mask. The treatment forms a treated insulator region in the buried insulator layer. In specific approaches, the treatment is applied to the top side of the SOI wafer. For example, the treatment could comprise the diffusion of dopant ions into the active layer and buried insulator. As another example, the treatment could comprise an ion implant to dope the buried insulator layer. The treatment uses the gate as a mask such that the treatment is effectively self-aligned. However, the gate could be used as either a negative or positive mask such that the treated insulator region could be formed in the buried insulator layer below the gate, or outside the lateral scope of the gate. The treatment could be applied in a wafer level process such that multiple gates on multiple devices would provide the pattern for the treated insulator layer. In situations in which the gate acted as a negative mask, the first exposure would prime the insulator layer that was outside the lateral scope of the gate to withstand a second processing step meant to ultimately form the treated insulator region within the lateral scope of the gate. In a particular example, the treatment will be a self-aligned ion implant into a buried oxide layer of a silicon on oxide wafer to form a doped region of the buried oxide that is aligned with, but outside the lateral scope of, the channels of the wafer.

SOI structure 400 in FIG. 4a further illustrates ion bombardment 412 which is directed to the top side of SOI wafer 401 using gate 408 as a mask. The ion bombardment could involve the implantation of dopant ions into buried insulator layer 406. The energy of the ion bombardment could be tuned to focus its effect on the insulator layer 406 while minimizing damage to active device layer 407. The ion bombardment could also be tuned to only affect a portion of buried insulator layer 406 such that the treated insulator region would be distinguishable from the untreated insulator region in both a lateral and vertical dimension. In particular, the treated insulator region could be positioned towards the back side of buried insulator layer 406 such that the treated insulator region was below portions of untreated insulator as well as to the left and right of untreated insulator.

Ion bombardment 412 could comprise various ion implant species. For example, the bombardment could comprise boron, phosphorous, or arsenic. In particular, the ion bombardment 412 could comprise dopant ions having a lower atomic weight than carbon and greater than lithium. In specific approaches, ion bombardment 412 will be conducted through regions of a silicon active device layer that may ultimately form the source and drain regions of a FET or the emitter of an IGBT. As such, the dopant ions can be chosen to minimize damage to these regions. While dopant ions that have low atomic weights are less likely to damage the active layer as they pass through, they are also less likely to be effective in treating the buried insulator to the extent that it can be selectively processed. Dopant ions with atomic weights that are less than carbon, but greater than lithium, are less likely to damage the active region as they pass through, while at the same time retaining their efficacy as the creators of a treated insulator region.

Process 300 continues with step 303 in which a portion of the substrate is removed. In specific approaches, the substrate is removed from the back side of the SOI wafer to expose the buried insulator layer. The substrate can be removed by a grinding process and may involve the application of a chemical-mechanical polish (CMP) processing step. The substrate could be removed in a single step or a multiple step process. In particular, a rapid grind could be applied to remove a majority of the substrate, while a slower process with higher selectivity to the buried insulator, such as a wet etch, could be applied as a second step. During step 303, the wafer may be held in place by a vacuum chuck or an alternative handler such that the back side of the SOI wafer could be readily accessed. Alternatively, the SOI wafer could be held in place by a handle wafer attached to the top side of the SOI wafer.

Process 300 can include an addition step 304 in which a handle wafer is bonded to the SOI wafer after the treatment is applied to the SOI wafer in step 302. The handle wafer can be bonded to the top side of the SOI wafer. The bond can be a permanent bond or a temporary bond. In situations where the bond is temporary, the SOI wafer may be transferred to another permanent handle wafer at a later time. The handle wafer can provide a stabilizing force to the active device layer of the SOI wafer while the substrate is removed in step 303. In addition, the handle wafer can serve as a permanent feature of the overall SOI structure such that the handle wafer continues to provide a stabilizing force to the active device layer after the substrate is removed. The handle wafer can comprise a trap rich layer as described in commonly assigned U.S. Pat. No. 8,466,036 and its related patents. The handle wafer can also comprise additional active or passive devices that can be electrically coupled to the active device layer of the SOI wafer.

Figure 4B:
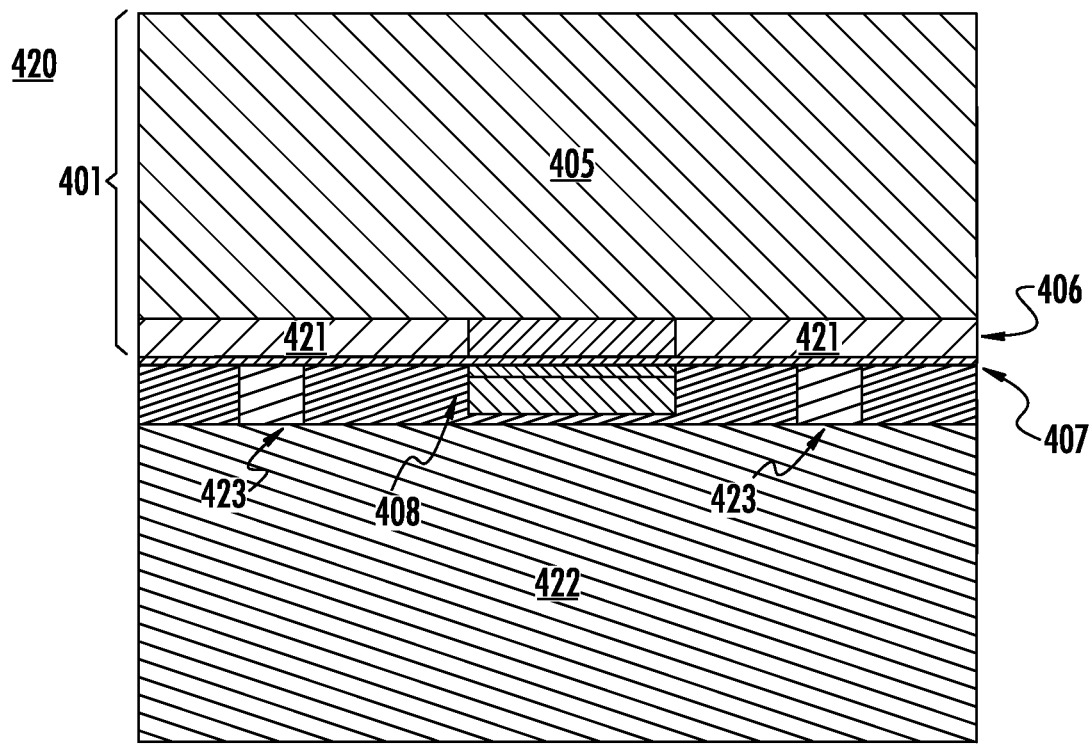

SOI structure 420 in FIG. 4b illustrates SOI wafer 401 after treated insulator region 421 has been formed in buried insulator layer 406. SOI structure 420 further illustrates how SOI wafer 401 has been bonded to handle wafer 422 and subsequently inverted for back side processing. Handle wafer 422 can be bonded to SOI wafer 401 using a permanent or temporary bond. Handle wafer 422 can comprise a trap rich layer and can additionally be comprised entirely of a trap rich material. As illustrated, mask 411 has been removed from the gate 408 at this point in the process. However, as stated previously, mask 411 may comprise a permanent portion of the device. Active device layer 407 is illustrated with contacts 423 connecting it to the handle wafer 422. However, contacts 423 are merely representative of the additional processing that SOI wafer 401 will undergo prior to the bonding of handle wafer 422. Although active device layer 407 can be connected to circuitry in handle wafer 422, the contacts may also connect to metallization layers meant to route signals solely within SOI wafer 401.

Various additional layers can be added to SOI wafer 401 to lie in-between active layer 406 and handle wafer 422. These layers can include metallization for routing signals between active devices in active device layer 406. The number of steps that lie between different approaches that are in accordance with cross sections 400 and 420 can include any kind of processing associated with variant technologies such as CMOS or BiCMOS. In specific approaches, standard CMOS fabrication will continue after step 302 and continue up to the deposition of inter-level dielectric, at which point step 304 can be executed. In other approaches, any number of additional wafers may be added to the top side of the SOI wafer before step 304 is executed. These additional wafers can contain trap rich layers and may also include additional passive and active circuitry that can be coupled to the circuitry in active device layer 407 using direct metal contacts, through silicon vias (TSVs), or similar structures.

Figure 4C:
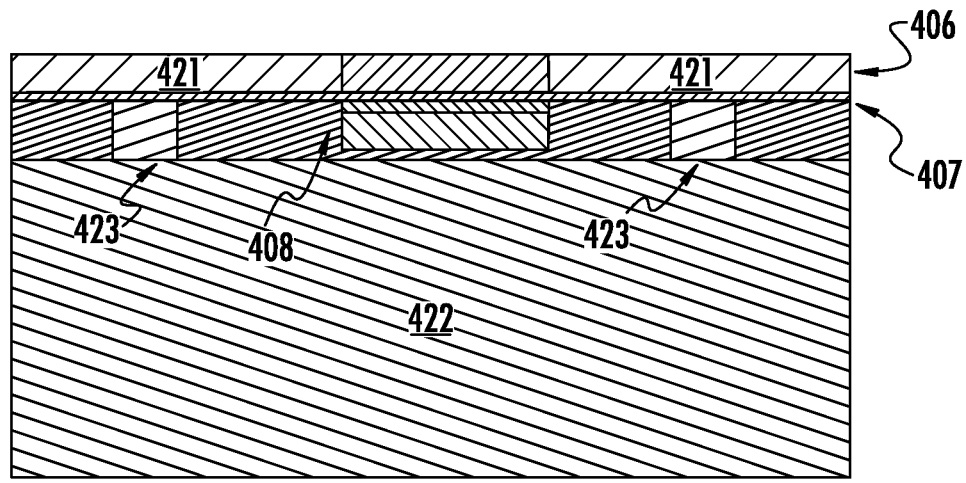

SOI structure 440 in FIG. 4c illustrates the SOI wafer after substrate 405 has been removed. As illustrated, substrate 405 has been completely removed from the back side of SOI wafer 401 to thereby expose treated insulator region 421. However, the substrate can also be removed in a patterned fashion. For example, the substrate might only be removed below certain regions of an overall die such as the regions in which active devices will ultimately be formed.

As a further example, the substrate might only be removed below certain features such as the regions that lie directly below the gates such as gate 408. In particular, the substrate can be partially removed such that a remaining portion of the substrate continues to provide a stabilizing force to active device layer 407 as the substrate is removed. The remaining portion of the substrate could also provide a stabilizing force to active device layer 407 in a final device. In these approaches, a handle wafer might not be needed, or a handle wafer might only be required while the substrate is partially removed, but the remaining substrate could provide the required stabilizing force to the active device layer in a final device.

Process 300 continues with step 305 in which the treated insulator region is selectively removed from the buried insulator layer. The removal of the treated insulator region from the insulator layer forms a remaining insulator region. As the gate was used to pattern the treated insulator region, the remaining insulator region will be aligned to the gate and lie under the active region of the SOI structure underneath the gate. A benefit of this approach is that the insulator region is thereby patterned without the need for an additional mask.

The insulator can be removed in step 305 using any process that is selective to the treated insulator region. Thus the removal process is linked to the treatment applied in step 302. As a particular example, the treatment could be the implantation of boron ions into a buried insulator layer comprising silicon dioxide to form a doped oxide, and the removal process could be a hydrofluoric etch delivered in vapor form that would remove the doped oxide and leave the untreated silicon dioxide in place. The selective removal process could comprise a wet hydrofluoric etch or a vapor hydrofluoric etch. In The insulator could alternatively be removed using a plasma etch.

Figure 4D:
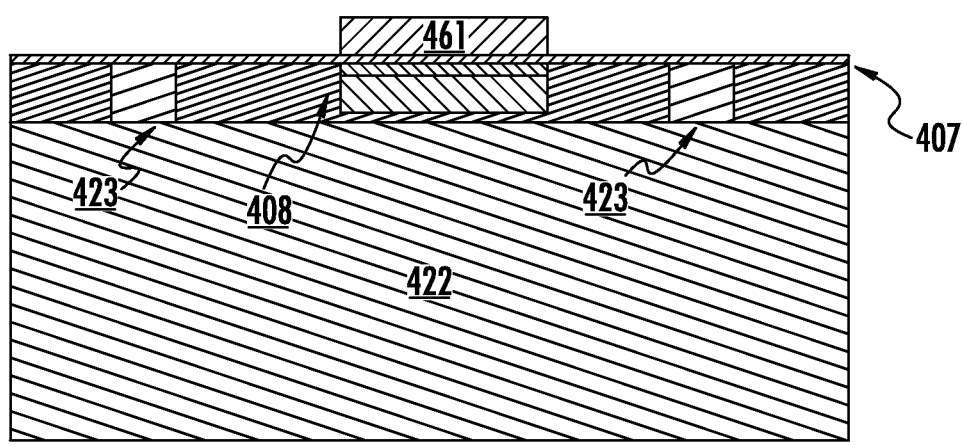

SOI structure 460 in FIG. 4d illustrates SOI wafer 401 after treated insulator region 421 has been removed. The resulting structure includes a self-aligned feature of remaining insulator 461 on the back side of a channel in active region 407. The original SOI insulator layer has been removed from other portions of the wafer while it remains underneath the gates that were used to pattern the treatment applied in step 302. As shown, the remaining insulator and the gate are both in contact with a channel formed in the device region. Depending on the selectivity of the removal process applied in step 305, remaining insulator region 461 may be thinner in both a lateral and vertical dimension than the original insulator region. However, an informed selection of the treatment to apply in step 302 and a removal process for step 305 that are both based on the material that comprises the original buried insulator layer, will lead to a highly selective removal process that contributes to the reliable alignment of the remaining insulator region 461 to the channel of devices in active region 407.

In alternative approaches, the selective removal process in step 305 will result in a negative pattern to that of the treatment applied in step 302. In an alternative step, just prior to step 305, the entire insulator region could undergo a second treatment after being exposed by the removal of the substrate, and then be acted upon by a selective removal process such that only the insulator region that was treated in step 302 would remain. In these approaches, the first treatment serves to counteract the effect of the second treatment such that only those portions of the insulator that did not receive the first treatment would remain after the application of the selective removal process.

Although SOI structure 460 illustrates treated insulator region 421 as having been completely removed in certain places, the treated insulator region could instead by removed to various degrees at different points along the lateral expanse of the back side of the SOI structure. As mentioned previously, the treatment from step 302 could be targeted to a specific depth of the buried insulator region such that treated insulator region 421 did not extend through the entire vertical expanse of the original buried insulator. For example, if the treatment from step 302 was targeted to just cover the back half of the insulator layer, the selective removal in step 305 could result in only half of the insulator region being removed at specific points in the overall pattern such that remaining insulator region 461 would be a raised plateau surrounded by an expanse of thinned remaining insulator.

Process 300 continues with step 306 in which a layer is deposited. The layer can be deposited on the back side of the SOI wafer. The layer can be formed on the remaining insulator region. The layer can be deposited via a blanket deposition or it can be a targeted deposition. The deposition step can use a mask, or it can rely only on the pattern formed by the remaining insulator region. The deposition can include a chemical enhanced vapor deposition (CVD), plasma enhanced CVD, atomic layer deposition (ALD), dielectric spin or sprat coating, or a high density plasma deposition (HDP). Alternatively, the layer could be formed by bringing the SOI wafer into contact with a conforming layer of material that would conform to the shape of the remaining insulator region. The conforming layer could be brought into contact using an additional wafer.

Figure 4E:
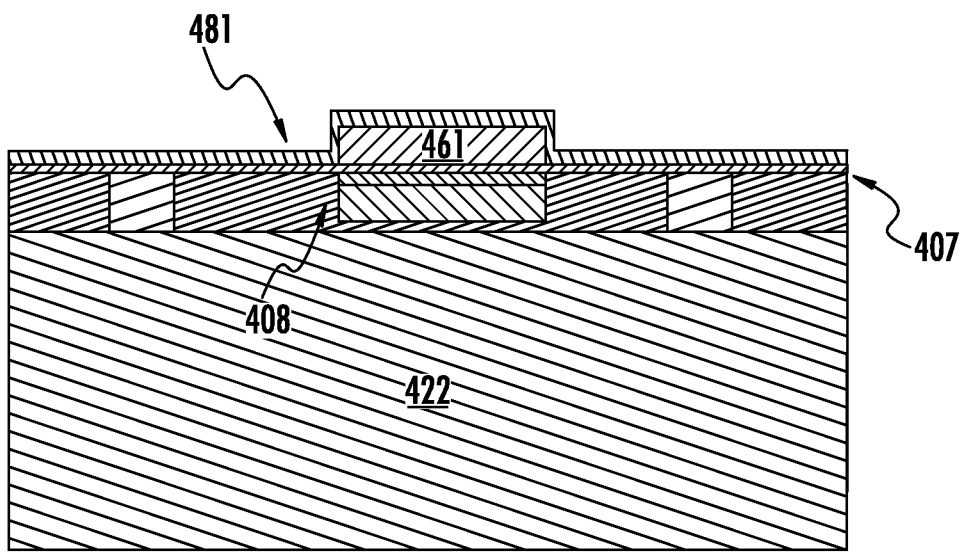

Cross section 480 in FIG. 4e illustrates the SOI wafer after layer 481 has been deposited on the back side of the wafer. Although only a single layer is illustrated, multiple layers can be deposited on the SOI wafer to achieve various results. In the illustrated example, removal of the treated insulator region exposed the device region 407, and the formation of layer 481 comprised a blanket deposition of material on the remaining insulator region 461 and the device region 407. In the illustrated example, the deposition was directed to the back side of the SOI wafer. Layer 481 could comprise a strain layer, a thermal dissipation layer, or any other region of material that would benefit from being patterned to surround the channels of active device in device region 407.

In contrast to example illustrated in FIG. 4e, but in accordance with examples mentioned previously, gate 408 could have a negative pattern relationship with the remaining insulator region such that the insulator was removed from beneath the channels but left in place in other regions of the structure. In these examples, the deposited layer could be an electrically insulating thermal dissipation layer. This approach would carry the benefit of placing the heat dissipation layer as close as possible to the heat generating channels of the active devices. However, these approaches would be accompanied by the risk of damage to the delicate channels of active devices in layer 407 unless specific tolerances were selected for the processing steps involved with the selective removal of the insulator, and the deposition of layer 481.

Figure 5:
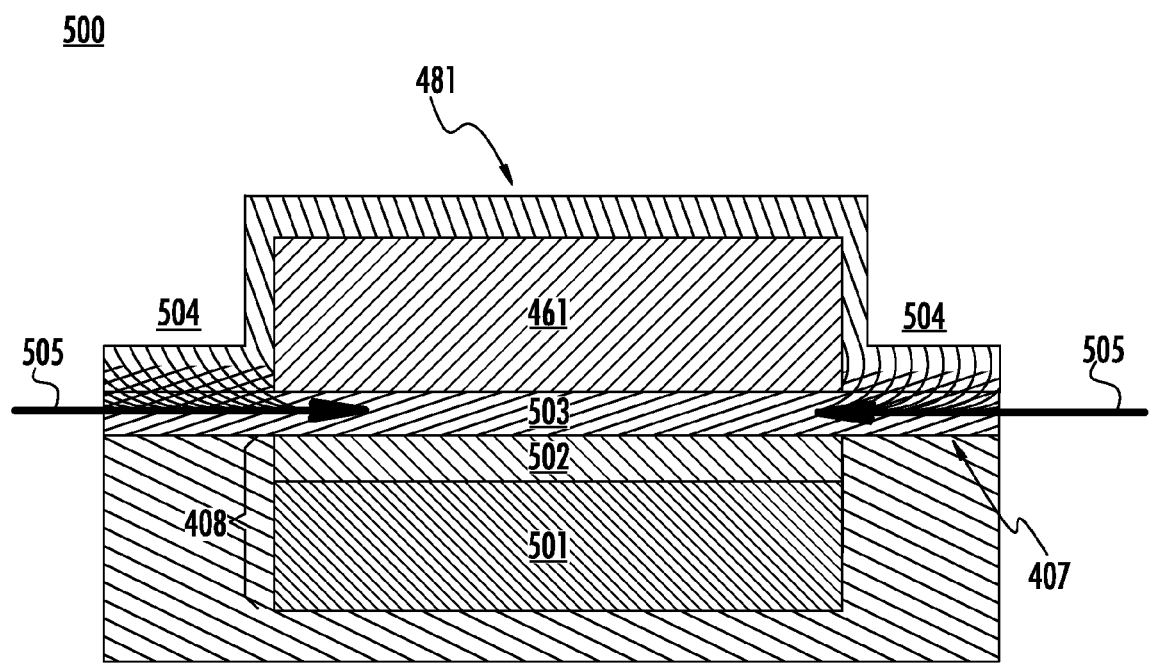
FIG. 5 illustrates the effect of a self-aligned back side strain layer on the channel of a transistor.

FIG. 5 displays a cross section 500 of a transistor in an SOI device that has been processed in accordance with the procedure described with reference to FIG. 3. Cross section 500 includes gate 408 which was formed on the SOI wafer. The gate includes gate electrode 501 and gate insulator 502. The cross section also illustrates channel region 503 that is associated with gate 408, and that is in contact with both the remaining insulator region 461 and the gate 408. As described previously, the gate 408 is formed on a top side of device region 407. Since the gate was used to pattern remaining insulator region 461, layer 481 is located in an excavated region of the buried insulator 504, on a back side of active device region 407, and along a vertical edge of the remaining insulator region 461.

Certain benefits accrue to approaches in which the edges of remaining insulator region 461 can be reliably aligned to gate 408. The processes described with reference to FIG. 3 provides a degree of alignment of these two features that is not otherwise attainable through reasonable commercial efforts. Using process 300, the vertical edge of gate 408 can be reliably aligned to the vertical edge of remaining insulator 461 within a margin of error that is constrained by the thickness of active device layer 407, the species and implant energy of any ions used to treat the insulator layer, the concentration doping concentration of the treated insulator region, and post implant thermal conditions that may alter the extent of the treated insulator region. As active device layer 407 decreases in thickness, the margin of error increases. As the implant energy and weight of any ions used to treat the insulator layer increases, the margin of error increases. As the doping concentration of the treated insulator region increases, the margin of error decreases. Based on simulations, approaches described with reference to FIG. 3 can provide reliable alignment of the gate 408 and the remaining insulator 461 to within a margin of error of less than 80 nanometers for a device region that is less than 100 nanometers thick. Notably, process 300 can achieve reliable alignment even when the ultimate device comprises fully depleted SOI devices with particularly thin active layers. The channel region 503 in these situations would comprise an ultra-thin body region.

As mentioned previously, layer 481 can be a strain inducing layer. The strain inducing layer can be a compressive or tensile film. The strain inducing layer can also induce strain in active device layer 407 through a lattice mismatch effect. For example, the strain inducing layer 481 could comprise silicon germanium while active device layer 407 comprised silicon in which case the mismatch of the two materials would induce strain in active device layer 407. The strain inducing layer can enhance the mobility of carriers in the device by inducing strain 505 in channel region 503. Strain layer 481 enhances the mobility of carriers in channel region 503, and thereby enhances the performance of devices formed in device layer 407. A strain layer benefits from being more closely aligned with the channel region because it is thereby able to more directly exert stain on the devices while at the same time not directly overlapping the channel region and deleteriously altering the behavior of the device.

Different combinations of the type of treatment applied to the insulator layer, and the type of strain layer deposited create different kinds of strain in channel region 503. As mentioned previously, depending upon the treatment applied to the insulator layer, the gate could be used as either a negative or positive mask such that the treated insulator region could be formed in the insulator layer below the gate, or outside the lateral scope of the gate. The strain induced by the strain layer can also be considered to exhibit a negative or positive strain in that the deposited film can be compressive or tensile respectively. Notably, this characteristic of the film can be independent of the pattern on which the film is applied. Therefore, the combination of independently positive or negative straining films with positive or negative patterns creates the potential for four different configurations that produce two different strain profiles (i.e., a negative film with a negative pattern creates a positive strain, both negative and positive combinations create a negative strain, and a positive film with a negative pattern creates a positive strain). This ability to achieve a given strain profile using different combinations provides a degree of freedom to the designer in that certain kinds of insulator treatment or strain layer materials can be avoided for cost or concerns regarding technical feasibility.

Additional variants of layer 481 also benefit from being tightly aligned to gate 408. For example, since channels are one of the largest sources of heat in a semiconductor device, thermal dissipation layers benefit from being closely aligned to the channel region in order to minimize the distance through which the heat must diffuse before being efficiently removed from the device. At the same time, it is important to keep the buried insulator in place below the channel as a thermal dissipative layer is generally a less effective substitute for the original buried insulator.

After step 306, additional processing steps can be conducted to connect to the circuitry in active device layer 407 as well as to package the final device. For example, the deposited layer could be patterned and etched to form contacts to devices in active device layer 407 to allow external connect. In addition, back side metallization can be formed on the back side of the SOI wafer to provide for interconnection between different circuit components in device layer 407. For example, the back side metallization may be used to connect a transistor to another transistor, a transistor to a diode, or a transistor to a passive component.

Figure 6:
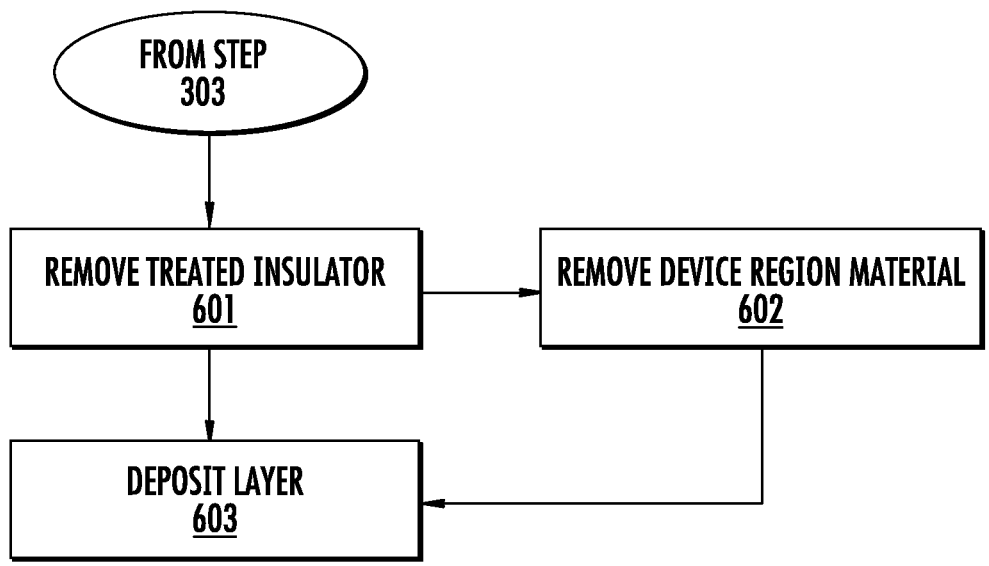
FIG. 6 illustrates a flow chart of a process for producing a semiconductor device with a dual gate transistor and self-aligned back side features.
Figure 7A:
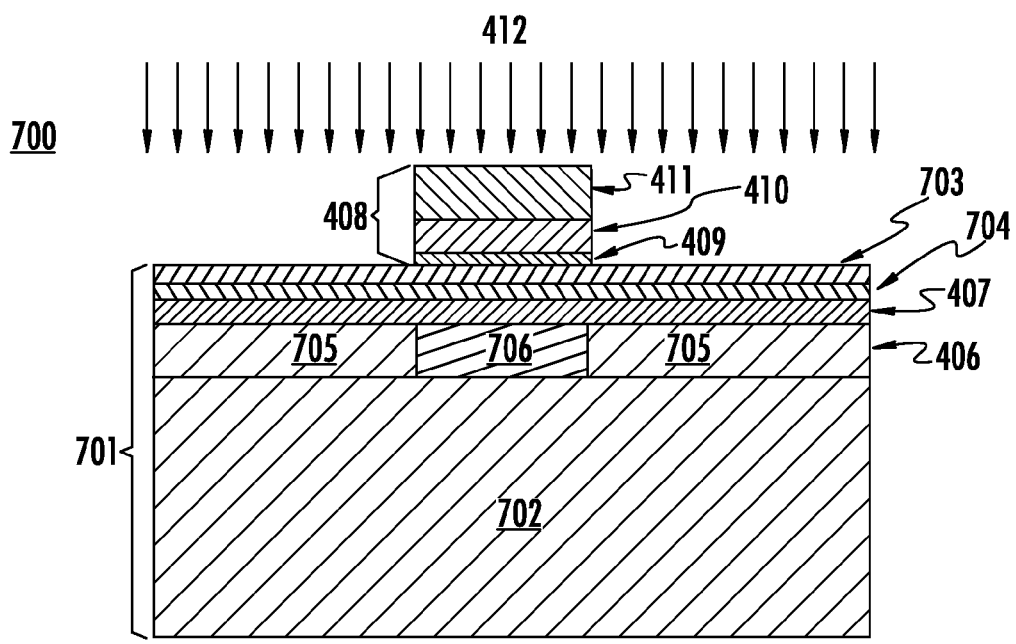
FIG. 7a-e illustrate a semiconductor structure at various stages of the process described with reference to FIG. 6.

FIG. 6 illustrates method 600 which continues method 300 at step 303. In method 600, steps 301-304 can be conducted as described above. However, method 600 is intended to operate on a wafer with an alternative structure to that which was described previously. Method 600 produces a self-aligned dual gate device. SOI structure 700 in FIG. 7a illustrates an SOI wafer 701 that can be processed in accordance with method 600. The starting wafer comprises many of the features of SOI wafer 401, and differs mainly in that substrate 702 is associated with not only buried insulator layer 406 and active device layer 407, but a second active layer 703 and a second buried insulator layer 704. As show in FIG. 7a, gate 408 is used as a mask for the implantation of dopant ions into SOI wafer 701. In contrast to method 300, the ion implant, or other treatment used in method 600, must be controlled to pass through second buried insulator layer 704 to instead treat buried insulator region 406 and form treated insulator region 705. As before, the formation of treated insulator region 705 leaves untreated insulator region 706 in its original state.

Figure 7B:
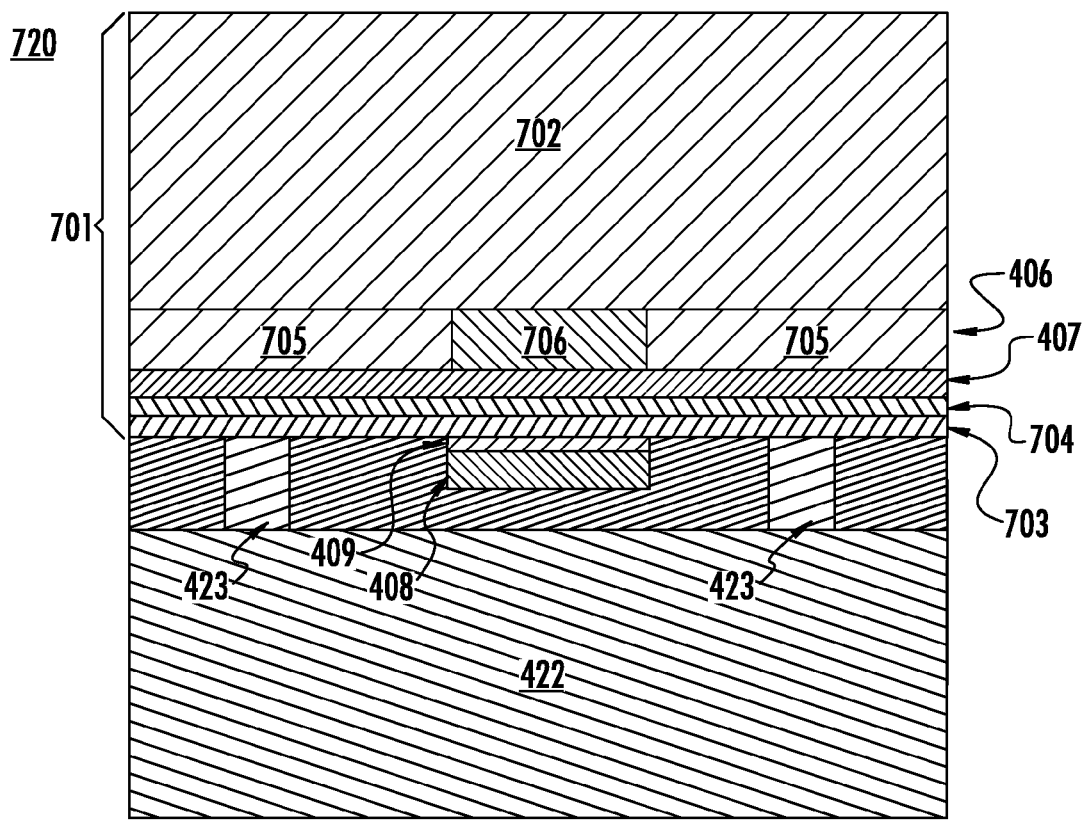
Figure 7C:
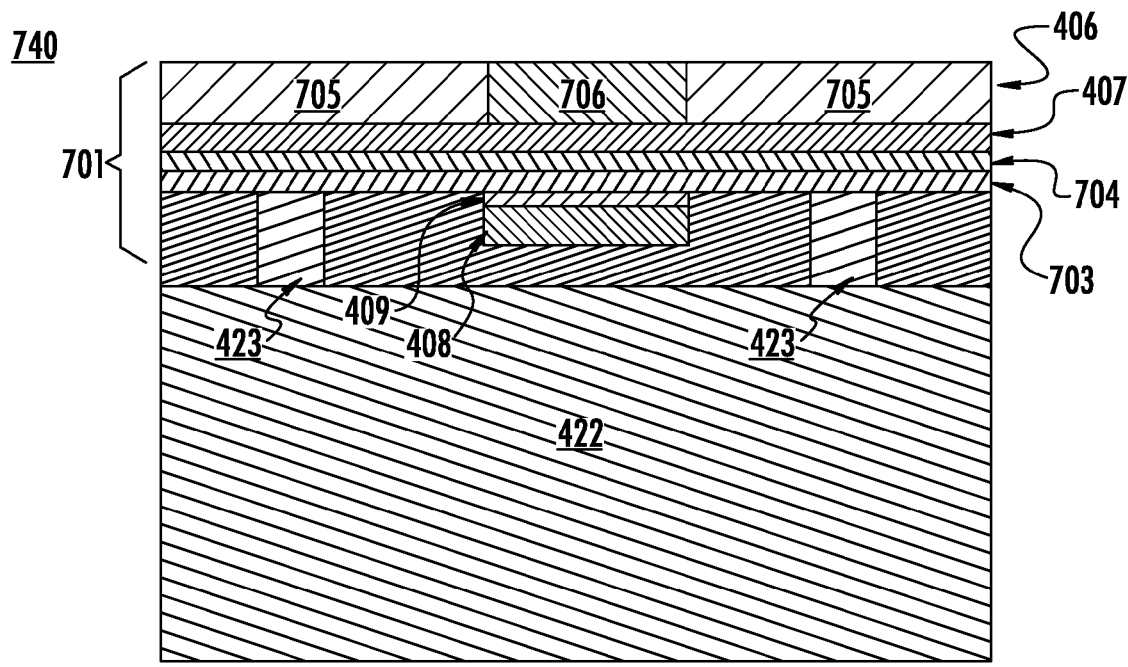

Any of the processing steps described with reference to process 300 can likewise be applied to method 600 as these processing steps continue. FIG. 7b illustrates SOI structure 720 as processing continues in a similar fashion to what was described with reference to FIG. 4b. The SOI wafer has been inverted, and an optional handle wafer 422 has been bonded to the top of the wafer. As mentioned previously, handle wafer 422 may comprise a trap rich layer. FIG. 7c illustrates cross section 740 after substrate 702 has been removed.

Figure 7D:
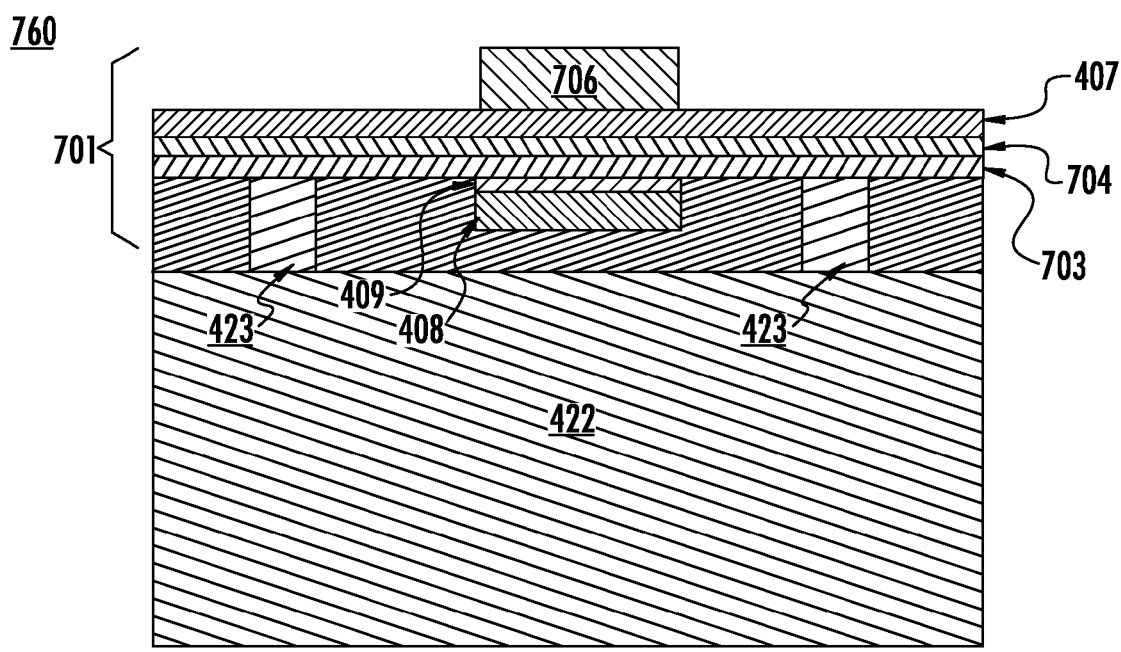

Method 600 continues with step 601 in which the treated insulator is removed from the buried insulator layer. An example of this processing step is illustrated by SOI structure 760 in FIG. 7d. SOI structure 760 shows the SOI wafer after treated insulator region 705 has been removed such that only untreated insulator layer 706 remains. At this point in the process, active device layer 407 is exposed while second active layer 703 and second buried insulator layer 704 remain covered.

Method 600 continues with either step 602 or 603. In step 602, a portion of the exposed device region is removed. The device region can be removed using remaining buried insulator 706 as a mask, or an additional mask may be used instead. The etchant used to etch device region 407 can perform an isotropic etch and may also involve a specific chemical etchant that is selective to second buried insulator 704. In step 603, a layer of material is deposited on the back side of the wafer. Step 603 can be conducted in accordance with any of the variations of step 306 discussed above.

Figure 7E:
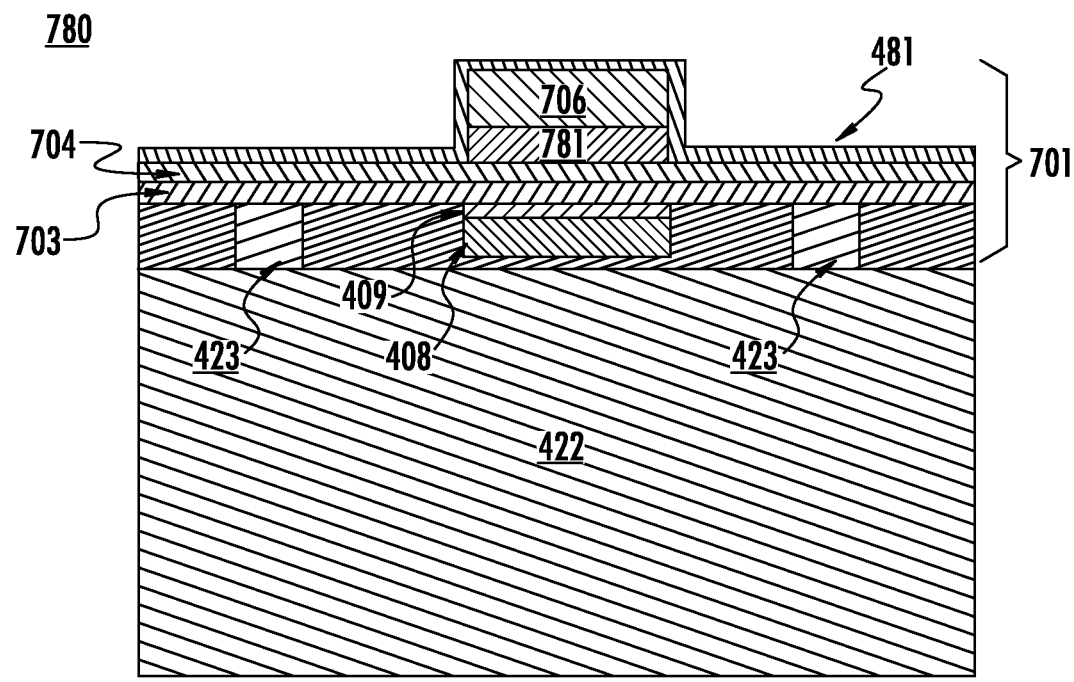

FIG. 7e illustrates SOI structure 780 which shows SOI wafer 701 after a portion of device region 407 has been removed to form remaining device region 781, and a layer 481 has been deposited on the back side of the wafer. In this situation, the remaining device region 781 serves as an additional gate electrode for a channel formed in second device region 703 while second buried insulator 704 serves as the gate insulator for the additional gate. The resulting structure comprises a self-aligned DG-FET. In this structure, gate 408 contacts second device region 703 and is associated with a channel formed in second device region 703. The remaining device region 781 servers as a second gate electrode for the same channel, and the remaining buried insulator 706 serves to isolate and shield remaining device region 781.

Insulator layer 406 in FIGS. 7a-e is thicker than second insulator layer 704 to illustrate certain benefits that accrue to such a structure. In particular, in situations where the treatment to the buried insulator layer is an ion implantation step, the thickness of insulator layer 406 makes it an easier target for implantation. At the same time, the thickness of a gate insulator is inversely proportional to certain figures of merit associated with the transistor—such as its transconductance. Since insulator layer 704 will serve as a gate insulator for the additional gate, it is beneficial to make insulator layer 704 relatively thin. Therefore, when used with an ion implantation treatment, process 600 is particularly amenable to the creation of a high performance DG-FET.

The dual gate structure illustrated in FIG. 7e benefits greatly from the degree of alignment provided by process 300 and 600 in that misaligned gates in a DG-FET can result in extra capacitance and a commensurate loss of current drive. However, when the gates are reliably aligned with a high degree of accuracy, the speed and power dissipation of a DG-FET is substantially lower than that of a single gate FET. Therefore, the creation of a dual gate structure according to a self-aligned process, such as process 600, can produce a superior transistor to approaches in which a separate mask is used to create additional gate electrode 781. The process of FIGS. 3 and 6 can reliably align the dual gates of the DG-FET with similar constraints to what was discussed above. However, in this situation, the thickness of the buried insulator is also a constraint on the reliability of the alignment because the implant is through both the buried insulator and the top active region. Based on simulations, approaches described with reference to FIGS. 3 and 6 can provide reliable alignment of the gate 408 and remaining device region 781 to within a margin of error of less than 70 nanometers for a device region that is less than 80 nanometers thick with a buried insulator thickness of 10 nanometers. Notably, process 300 can achieve reliable alignment even when the ultimate device comprises fully depleted SOI devices with particularly thin active layers. The channel region 503 in these situations would comprise an ultra-thin body region.

Deposited layer 481 can take on any of the characteristics described above with reference to FIGS. 4e and 5. In particular, deposited layer 481 can be a strain layer that enhances the mobility of carriers in the channel formed in second device layer 704. As described previously, the film can be compressive or tensile. Layer 481 can also be a thermal dissipation layer. Also, as noted above with reference to FIG. 4e, SOI structure 780 can undergo additional processing steps to connect to circuitry in active layer 703. In addition, SOI structure 780 can undergo additional processing steps to connect gate electrode 781 to circuitry in different wafers, on a package, or to circuitry in active layer 703. In particular, gate electrode 781 could be connected to the same circuitry as the gate electrode of gate 408.

Although some embodiments in the above disclosure were specifically illustrated by cross sections wherein a gate structure is used as the mask for an initial treatment of an SOI insulator layer, other features can be used to mask the initial treatment instead. Indeed, any feature to which back side alignment is desired could be used to pattern the applied treatment. Depending upon the characteristics of the feature, the material used to define the feature could be used as a mask itself, or the actual mask used to pattern that feature can be used as the mask for the initial treatment. As a particular example, the mask used to pattern TSVs in the SOI wafer could also be used to apply a treatment to the insulator. Such an approach would be useful in situations where the TSVs were intended to be connected through the back side insulator.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method comprising:
   forming a gate on a semiconductor on insulator wafer, wherein the semiconductor on insulator wafer comprises a device region, a buried insulator, and a substrate;
   applying a treatment to the semiconductor on insulator wafer using the gate as a mask, wherein the treatment creates a treated insulator region in the buried insulator;
   removing at least a portion of the substrate; and
   after removing the portion of the substrate, selectively removing the treated insulator region from the buried insulator to form a remaining insulator region aligned with the gate and exposing a back side of an active layer of the device region.

2. The method of claim 1, further comprising:
   after applying the treatment to the semiconductor on insulator wafer, bonding a handle wafer to the semiconductor on insulator wafer;
   wherein removing at least a portion of the substrate comprises removing the entire substrate; and
   wherein the handle wafer provides a stabilizing force to the device region of the semiconductor on insulator wafer while the substrate is removed and after the substrate is removed.

3. The method of claim 1, further comprising:
after removing the treated insulator region, forming a thermally conductive layer on the remaining insulator region.

4. The method of claim 1, wherein:
the treatment comprises the implantation of dopant ions into the buried insulator; and
the treated insulator is removed using a vapor etchant.

5. The method of claim 1, further comprising:
after removing the treated insulator region, removing a portion of the device region;
wherein the semiconductor on insulator wafer comprises a second buried insulator and a second device region;
wherein the gate comprises a gate electrode for a channel formed in the second device region; and
wherein the device region comprises an additional gate electrode for a channel formed in the second device region.

6. The method of claim 1, further comprising:
after removing the treated insulator region, forming a strain layer on the remaining insulator region.

7. The method of claim 4, wherein:
the dopant ions have a lower atomic weight than carbon; and
the etchant is hydrofluoric.

8. The method of claim 5, wherein:
the second buried insulator is thinner than the buried insulator.

9. The method of claim 6, wherein:
removal of the treated insulator region exposes the device region; and
forming the strain layer comprises a blanket deposition of a strain material on the remaining insulator region and the device region.

10. The method of claim 9, wherein:
the remaining insulator and the gate are both in contact with a channel formed in the device region; and
the strain layer enhances the mobility of carriers in the channel.

11. A method comprising:
forming a gate on a top side of a semiconductor on insulator wafer and above an active layer;
after forming the gate, applying a treatment to the top side of the semiconductor on insulator wafer to form a treated region in an insulator layer of the semiconductor on insulator wafer;
removing a substrate from the back side of the semiconductor on insulator wafer to expose the insulator layer; and
after removing the substrate, selectively removing the treated region from the insulator layer to expose a back side of the active layer and forming a remaining insulator region aligned with the gate;
wherein the gate is used to pattern the treated region such that the treated region is formed in a self-aligned manner.

12. The method of claim 11, wherein:
the treatment comprises the implantation of ions into the insulator layer; and the treated region is removed using a vapor etchant.

13. The method of claim 11, further comprising:
before removing the substrate, attaching a handle wafer to a top side of the semiconductor on insulator wafer; and
after removing the treated region, depositing a strain layer on the back side of the semiconductor on insulator wafer;
wherein the strain layer enhances the mobility of carriers in a channel located above a remaining portion of the insulator layer and below the gate.

14. The method of claim 11, further comprising
after removing the treated insulator region, removing a portion of the device region;
wherein the semiconductor on insulator wafer comprises a second buried insulator above the buried insulator and a second device region above the device region;
wherein the gate comprises a gate electrode for a channel formed in the second device region; and
wherein the device region comprises an additional gate electrode for a channel formed in the second device region.

15. The method of claim 13, wherein:
the semiconductor on insulator wafer comprises a silicon substrate;
the substrate is removed at least partially by grinding from the back side of the semiconductor on insulator wafer;
the insulator layer comprises silicon dioxide;
the treatment comprises the implantation of ions into the insulator layer; the treated region is removed using a vapor etchant; and
the gate controls the channel of a fully depleted transistor.

16. The method of claim 14, wherein:
the second buried insulator is thinner than the buried insulator.

* * * * *